(12) United States Patent
Light-Holets

(10) Patent No.: US 10,755,492 B2
(45) Date of Patent: Aug. 25, 2020

(54) VEHICLE HAZARD MANAGEMENT SYSTEM

(71) Applicant: Cummins Inc., Columbus, IN (US)

(72) Inventor: Jennifer Kay Light-Holets, Greenwood, IN (US)

(73) Assignee: Cummins Inc., Columbus, IN (US)

( * ) Notice: Subject to any disclaimer, the term of this patent is extended or adjusted under 35 U.S.C. 154(b) by 0 days.

(21) Appl. No.: 16/150,878

(22) Filed: Oct. 3, 2018

(65) Prior Publication Data

US 2019/0304207 A1    Oct. 3, 2019

Related U.S. Application Data

(60) Provisional application No. 62/649,084, filed on Mar. 28, 2018.

(51) Int. Cl.
*G07C 5/00* (2006.01)
*B60L 3/00* (2019.01)
(Continued)

(52) U.S. Cl.
CPC ............ *G07C 5/008* (2013.01); *B60L 3/0007* (2013.01); *B60R 21/0136* (2013.01);
(Continued)

(58) Field of Classification Search
CPC ..... G07C 5/008; G07C 5/0808; B60L 3/0007; B60R 21/0136; B60R 2021/0027; G01R 31/006
See application file for complete search history.

(56) References Cited

U.S. PATENT DOCUMENTS 5,547,208 A * 8/1996 Chappell ................. E05B 77/12
180/281
6,116,363 A * 9/2000 Frank ....................... B60K 6/48
180/65.25
(Continued)

FOREIGN PATENT DOCUMENTS

CN      105799518 A     7/2016
JP        5305390 B2     10/2013
(Continued)

OTHER PUBLICATIONS

European Search Report issued by the European Patent Office, dated Sep. 4, 2019 for EP 19163399; 8 pages.

*Primary Examiner* — Joseph H Feild
*Assistant Examiner* — Rufus C Point
(74) *Attorney, Agent, or Firm* — Faegre Drinker Biddle & Reath LLP

(57) ABSTRACT

The present disclosure provides A vehicle hazard management system mounted to a vehicle having a high voltage system, comprising: a sensor configured to provide an activation signal in response to at least one of a collision involving the vehicle, a fault of the high voltage system, and at least partial submersion of the vehicle; a controller in communication with the sensor, the controller being configured to receive the activation signal and respond by generating an emergency message including information describing at least one of the make, model and year of the vehicle; and a transmitter coupled to the controller and configured to transmit the emergency message to an emergency communication device.

15 Claims, 5 Drawing Sheets

(51) Int. Cl.
*B60R 21/0136* (2006.01)
*G01R 31/00* (2006.01)
*G07C 5/08* (2006.01)
*G08B 25/01* (2006.01)
*G08G 1/00* (2006.01)
*B60R 21/00* (2006.01)

(52) U.S. Cl.
CPC .......... *G01R 31/006* (2013.01); *G07C 5/0808* (2013.01); *G08B 25/016* (2013.01); *G08G 1/205* (2013.01); *B60R 2021/0027* (2013.01)

(56) References Cited

U.S. PATENT DOCUMENTS

| | | | |
|---|---|---|---|
| 6,377,169 B1 * | 4/2002 | Yanagisawa | G08B 25/001 340/3.1 |
| 6,642,844 B2 | 11/2003 | Montague | |
| 8,604,919 B2 | 12/2013 | Otterson | |
| 8,749,350 B2 | 6/2014 | Geisler et al. | |
| 8,781,657 B2 | 7/2014 | Pebbles | |
| 8,981,917 B2 | 3/2015 | Hiramatsu et al. | |
| 9,278,619 B2 | 3/2016 | Stadler et al. | |
| 10,157,423 B1 * | 12/2018 | Fields | B60W 50/0205 |
| 2004/0142678 A1 | 7/2004 | Krasner | |
| 2008/0119966 A1 * | 5/2008 | Breed | G07C 5/008 701/2 |
| 2009/0077266 A1 * | 3/2009 | Alrabady | G07C 5/008 709/249 |
| 2012/0050067 A1 * | 3/2012 | Otterson | G08G 1/205 340/902 |
| 2012/0146766 A1 * | 6/2012 | Geisler | H04W 4/90 340/8.1 |
| 2013/0024306 A1 * | 1/2013 | Shah | G06Q 20/32 705/17 |
| 2014/0021914 A1 | 1/2014 | Martin et al. | |
| 2014/0309864 A1 * | 10/2014 | Ricci | B60N 2/0244 701/36 |
| 2015/0015418 A1 | 1/2015 | Stanek et al. | |
| 2015/0051771 A1 | 2/2015 | Greenwood et al. | |
| 2015/0224881 A1 * | 8/2015 | Deyda | B60R 21/01 701/29.2 |
| 2016/0059866 A1 * | 3/2016 | Kim | B60L 3/0046 701/22 |
| 2016/0163192 A1 * | 6/2016 | Krams | B60L 3/0007 340/907 |
| 2018/0308639 A1 * | 10/2018 | Ikegaya | B60R 16/03 |
| 2019/0077273 A1 * | 3/2019 | Jang | H02J 7/0071 |

FOREIGN PATENT DOCUMENTS

| | | |
|---|---|---|
| JP | 5974888 B2 | 8/2016 |
| WO | 2017111875 A1 | 6/2017 |

* cited by examiner

VEHICLE HAZARD MANAGEMENT SYSTEM

CROSS-REFERENCE TO RELATED APPLICATIONS

The present application claims the benefit of and priority to U.S. Provisional Application Ser. 62/649,084, entitled "VEHICLE HAZARD MANAGEMENT SYSTEM," filed on Mar. 28, 2018, the entire contents of which being expressly incorporated herein by reference.

FIELD OF THE DISCLOSURE

The present disclosure generally relates to alternative fuel vehicles ("AFVs") and more particularly to systems for managing hazards associated with such AFVs.

BACKGROUND

Special training, tools and information are often required for emergency responders, such as the Fire Service and EMS, to safely handle emergency situations involving AFVs. Such AFVs include, for example, electric vehicles, hybrid vehicles, fuel cell vehicles and gaseous fuel vehicles. As the configuration of each AFV varies by make, model and year, vehicle manufacturers provide emergency response guides for use by first and second responders that provide vehicle and safety information unique to the particular AFV. Currently, collections of these emergency response guides are made available through websites hosted, for example, by the National Fire Protection Association. The guides vary based on the type of architecture, system(s) and component(s) used in the AFV.

In general, emergency responders are required to locate various badges or other identifiers on the AFV and/or to decode the VIN of the AFV to properly identify the vehicle make, model and year. After the AFV is properly identified, the emergency responder must then locate the corresponding emergency response guide. Of course, in emergency situations such as fighting a fire or assisting injured people, time is of the essence, and any delays in identifying the AFV and accessing the corresponding emergency response guide may result in further property damage, more severe injuries or even death.

Additionally, when water is involved, the dangers presented by AFVs, particularly those with high voltage systems, may be even more severe. It is well known that water is a good conductor of electricity and electric vehicles and hybrid vehicles store large amounts of electrical energy in on-board batteries. The emergency response guides for such AFVs instruct the emergency responders how to safely treat the vehicles when water is involved, which may occur as a result of flooding or driver error. Many AFVs have a high voltage service disconnect and/or an emergency disconnect which must be accessed by the emergency responders. While some AFVs include a high voltage battery that discharges automatically when a collision is detected such as by a motion detector, not all AFVs include this feature. Additionally, some vehicles become at least partially submerged in water as a result of flooding or other events, where no collision occurs.

Thus, what is needed is an improved approach to enable emergency responders to quickly and safely respond to situations involving AFVs.

SUMMARY

According to one embodiment, the present disclosure provides a vehicle hazard management system mounted to a vehicle having a high voltage system, comprising: a sensor configured to provide an activation signal in response to at least one of a collision involving the vehicle, a fault of the high voltage system, and at least partial submersion of the vehicle; a controller in communication with the sensor, the controller being configured to receive the activation signal and respond by generating an emergency message including information describing at least one of the make, model and year of the vehicle; and a transmitter coupled to the controller and configured to transmit the emergency message to a communication device. In one aspect of this embodiment, the emergency message includes information identifying the vehicle as a hybrid vehicle or an electric vehicle. In another aspect, the emergency message includes one of an emergency response guide corresponding to the vehicle or a link to an emergency response guide corresponding to the vehicle. In yet another aspect, the emergency message further includes information identifying the location of the vehicle. In still another aspect of this embodiment, the controller is coupled to a discharge device of the vehicle, the controller responding to the activation signal by causing the discharge device to discharge energy stored in the high voltage system. In another aspect, the transmitter transmits the emergency message to a cell tower, which relays the emergency message to the communication device. In yet another aspect, the transmitter is a Bluetooth transmitter. In still another aspect of this embodiment, the controller further includes a GPS unit configured to determine a current location of the vehicle. In another aspect, the controller is further configured to respond to the activation signal by deactivating the high voltage system and enabling an engine to power the vehicle. In another aspect, the controller is further configured to respond to the activation signal by causing the transmitter to transmit a deactivation signal to deactivate a charging station coupled to the high voltage system. In a variant of this aspect, the controller is further configured to response to the activation signal by causing the transmitter to transmit the deactivation signal to another vehicle hazard management system.

In another embodiment, the present disclosure provides a vehicle hazard management system mounted to a vehicle having a high voltage system, comprising: a water sensor configured to provide an activation signal in response detection of at least partial submersion of the vehicle; a controller in communication with the water sensor; and a high voltage system discharge device in communication with the controller; wherein the controller is configured to respond to receipt of an activation signal from the water sensor by causing the high voltage system discharge device to discharge energy stored in the high voltage system. In one aspect of this embodiment, the controller is further configured to respond to the activation signal by causing a transmitter to transmit a deactivation signal to deactivate a charging station coupled to the high voltage system. In another aspect, the controller is further configured to response to the activation signal by causing the transmitter to transmit the deactivation signal to another vehicle hazard management system.

In still another embodiment, the present disclosure provides a method of managing hazards associated with a vehicle having a high voltage system, comprising: sensing an activation event including at least one of a collision involving the vehicle, a fault of the high voltage system, and at least partial submersion of the vehicle; generating an activation signal in response to the sensed activation event; responding to the activation signal by generating an emergency message including information describing at least one of the make, model and year of the vehicle; and transmitting the emergency message to a communication device. In one aspect of this embodiment, the emergency message includes one of an emergency response guide corresponding to the vehicle or a link to an emergency response guide corresponding to the vehicle. In another aspect, the emergency message further includes information identifying the location of the vehicle. In yet another aspect of this embodiment, responding to the activation signal further comprises causing a discharge device coupled to the high voltage system to discharge energy stored in the high voltage system. In still another aspect, transmitting the emergency message to a communication device further comprises transmitting the emergency message to a cell tower, which relays the emergency message to the communication device. In another aspect, responding to the activation signal further comprises at least one of deactivating the high voltage system or deactivating a charging station coupled to the high voltage system.

BRIEF DESCRIPTION OF THE DRAWINGS

The above-mentioned and other features of this disclosure and the manner of obtaining them will become more apparent and the disclosure itself will be better understood by reference to the following description of embodiments of the present disclosure taken in conjunction with the accompanying drawings, wherein.

Figure 1:
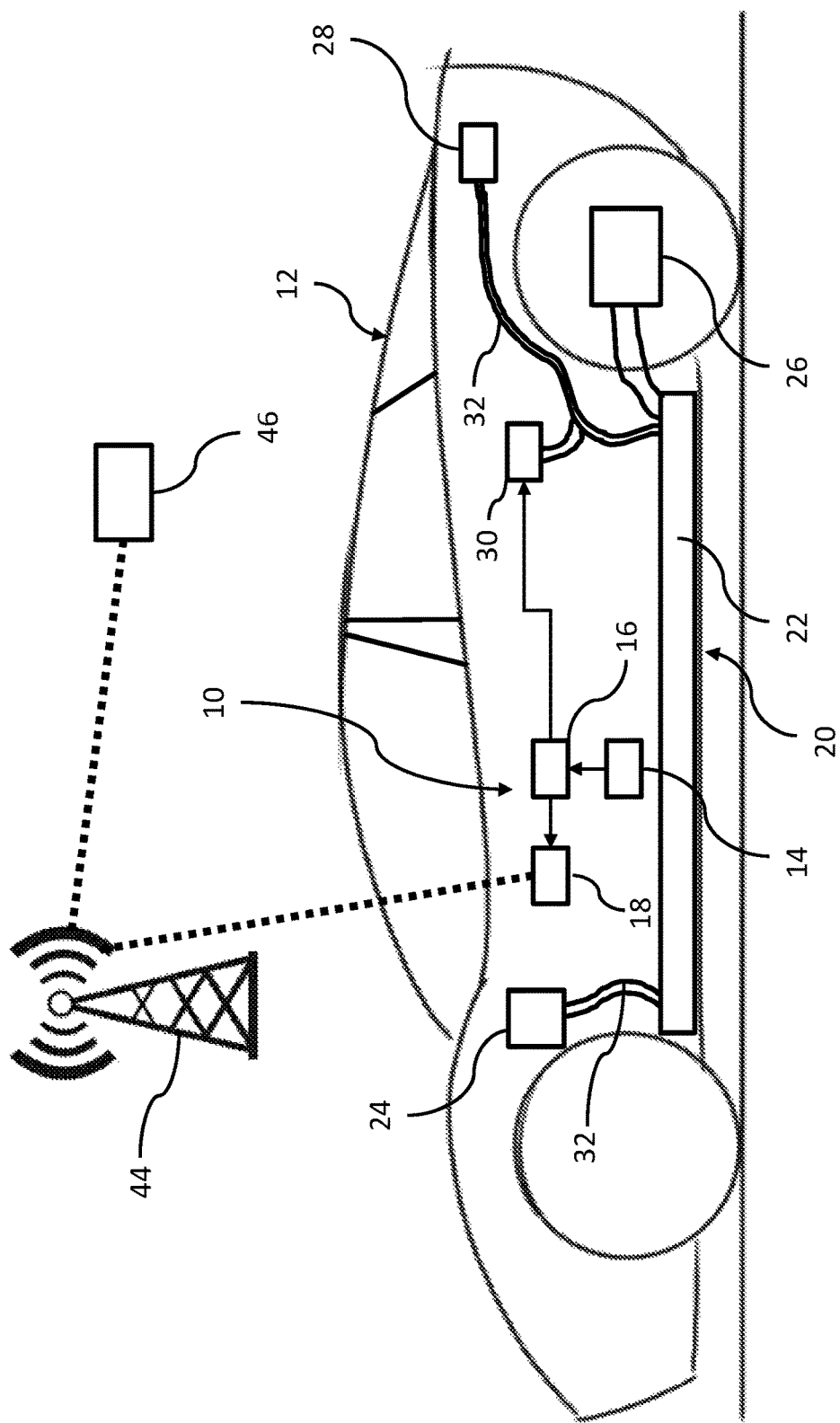
FIG. 1 is a schematic diagram of a vehicle hazard management system according to one embodiment of the present disclosure.

Although the drawings represent embodiments of the various features and components according to the present disclosure, the drawings are not necessarily to scale and certain features may be exaggerated in order to better illustrate and explain the present disclosure. The exemplification set out herein illustrates embodiments of the disclosure, and such exemplifications are not to be construed as limiting the scope of the disclosure in any manner.

DETAILED DESCRIPTION OF EMBODIMENTS OF THE DISCLOSURE

For the purpose of promoting an understanding of the principles of the disclosure, reference will now be made to the embodiments illustrated in the drawings, which are described below. It will nevertheless be understood that no limitation of the scope of the disclosure is thereby intended. The disclosure includes any alterations and further modifications in the illustrated device and described methods and further applications of the principles of the disclosure, which would normally occur to one skilled in the art to which the disclosure relates. Moreover, the embodiments were selected for description to enable one of ordinary skill in the art to practice the disclosure.

The present disclosure provides, among other things, systems for automatically communicating key information to emergency responders in the event of an AFV crash (as detected by a motion sensor, airbag system, seat belt pre-tensioning system, etc.), a catastrophic battery fault and/or a water immersion event. The key information that is automatically reported to responders (generally through 911 in the United States) may include the location of the vehicle, the vehicle make, model and year, information indicating whether the vehicle is a hybrid vehicle or an electric vehicle, and an emergency response guide corresponding to the vehicle or a link to an emergency response guide corresponding to the vehicle. By automatically communicating this information to the emergency responders at the time of the emergency event, the system permits the responders to identify and consult the emergency response guide corresponding to the vehicle either before leaving or while en route to the scene, and eliminates the delays associated with searching for vehicle badges, markings, VIN, etc. on the scene. In this manner, emergency responders may suit up with appropriate personal protective equipment ("PPE") and prepare any other equipment needed for the response for the particular AFV involved in the incident in advance of arriving at the scene.

In another aspect of the present disclosure, AFVs are provided with a "black box" type device which in certain embodiments is heat resistant and capable of communicating wirelessly, via RF, or otherwise with an emergency responder device such as a computer in the emergency vehicle, a handheld device, a mobile phone, etc. When on-site, the emergency responder device receives from the black box and then broadcasts, displays or otherwise communicates some or all of the following information: 1) a warning that the vehicle is an AFV; 2) the make, model and year of the AFV; and 3) appropriate emergency response guide information for the AFV. In this manner, emergency responders can consult the appropriate emergency response guide and proceed safely with the response without having to search for vehicle identification information.

In another embodiment of the present disclosure, a system is provided that detects when an AFV has either driven into water and stopped or has become partially submerged in water when not in operation (e.g., parked in a lot that has become flooded). In the case of a parallel hybrid AFV, if the batteries are at risk of becoming flooded (i.e., the batteries are located underneath the vehicle) and the engine has not yet flooded (e.g., because the engine is mounted at a higher location such as in a commercial AFV), the system may automatically deactivate the batteries and switch to internal combustion power only and/or take action with the batteries, such as discharging them. This response may be particularly suitable for commercial AFVs due to the potentially greater height difference between the batteries and the engine as compared to a passenger AFV. Additionally, if the AFV has a range-extender, the system may discontinue providing charge to the batteries from the range-extender.

In situations where the AFV is being charged externally when a flooding event occurs, the system may automatically deactivate the charging system. In the case of a fleet of AFVs being charged when a flooding event occurs, when a system on an AFV located in one area detects flooding, the system may communicate with other AFVs nearby to cause those AFVs to deactivate their charging system and/or to prepare their batteries to be discharged.

Referring now to FIG. 1, a vehicle hazard management system 10 is shown in use with an AFV 12. System 10 generally includes a sensor 14, a controller 16 and a transmitter 18. AFV 12 generally includes a high voltage system 20 including a battery 22 (or collection of batteries), a DC-DC converter 24, a drive unit 26, a charge port 28 and a discharge device 30. The components of high voltage system 20 are connected via high voltage cabling 32. While AFV 12 is depicted as a fully electric vehicle, it should be understood that the principles of the present disclosure apply equally to any type of AFV including hybrid vehicles, fuel cell vehicles, gaseous fuel vehicles and any other vehicle that presents hazards to emergency responders. In AFV 12, electricity is supplied to battery 22 through charge port 28 using a conventional charging system. Battery 22 may include one or more cells that employ any of various suitable energy storage technologies such as lithium-ion batteries. Battery 22 provides the stored electricity to drive unit 26, which converts DC current into 3-phase AC current that one or more electric motors (not shown) use to power the rear wheels. DC-DC converter 24 transforms the high voltage current from battery 22 to low voltage for charging a standard 12 volt battery (not shown), which powers various components of AFV 12 such as the supplementary restraint system, ignition system, airbags, displays and lighting components. In certain embodiments, discharge device 30 causes battery 22 to discharge when activated by system 10. In certain embodiments, the electrical energy from battery 22 is drained through a resistive device such as a heater. As explained herein, discharge device 30 may cause battery 22 to discharge its energy before rising water reaches battery 22.

Sensor 14 of system 10 may include one or more sensor devices as described herein, including a collision sensor and/or a water sensor. Sensor 14 may include one or more accelerometers or other motion detection devices that detect a sudden impact or may be integrated into an airbag system or seat belt pretensioning system of AFV 12 that provides collision detection functionality. In any event, sensor 14 provides an activation signal to controller 16 when an activation event occurs such as a collision, a fault involving battery 22, or at least a partial water submersion event. The activation signal initiates a response by system 10 in the manner described below.

Figure 2:
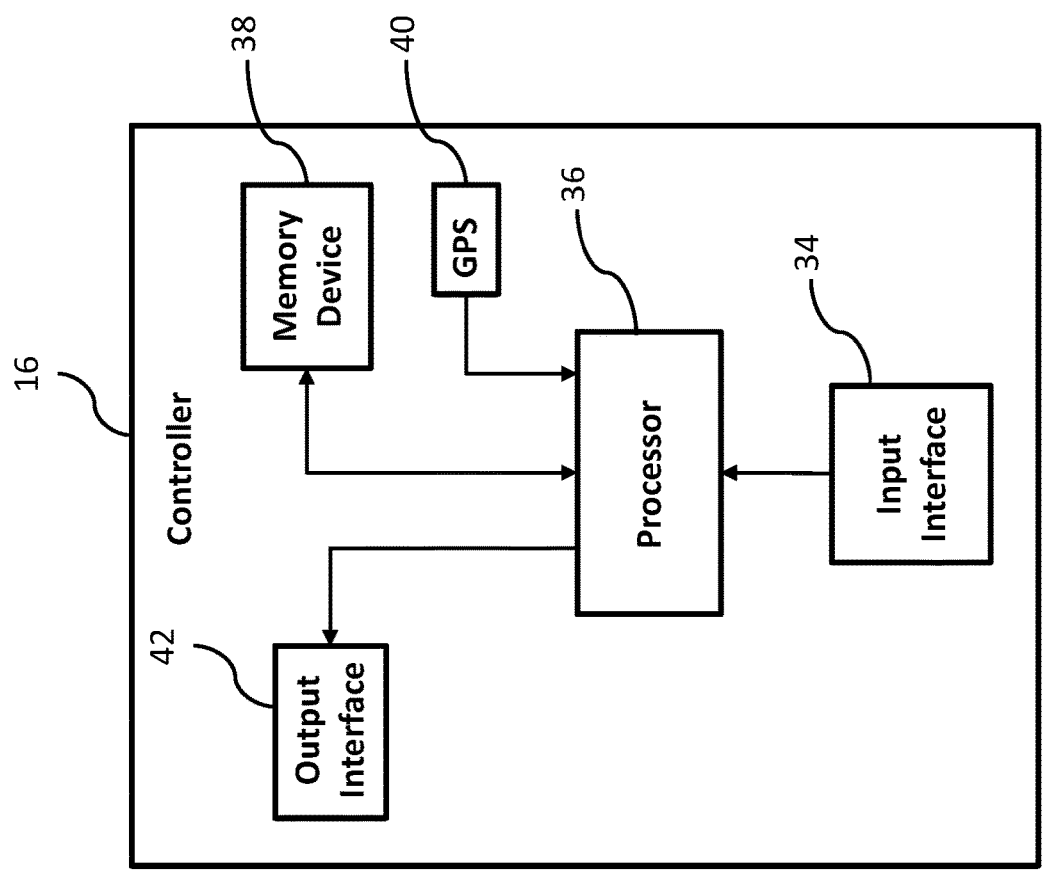
FIG. 2 is a block diagram of a controller of the system of FIG. 1.

Controller 16 may be a stand-alone device or may be part of an Engine Control Module ("ECM") in vehicles having internal combustion engines. Controller 16 may include one or more computing devices having memory, processing and communication hardware, firmware and/or software. Controller 16 may be a single device or a distributed device, and the functions of the controller may be performed by hardware and/or as computer instructions on a non-transient computer readable storage medium. As shown in FIG. 2, in certain embodiments controller 16 may include an input interface 34, a processor 36, a memory device 38, a GPS unit 40, and an output interface 42. Input interface 34 communicates the activation signals from sensor 14 to processor 36. Processor 36 is programmed to respond to receipt of an activation signal by performing one or more of a variety of functions as described herein.

In certain embodiments, processor 36 responds to receipt of an activation signal by generating an emergency message that is communicated by output interface 42 to transmitter 18. Processor 36 may generate an emergency message by accessing memory device 38 to obtain information stored in memory device 38 identifying the make, model and year of manufacture of AFV 12. Processor 36 may also access GPS unit 40 to obtain information regarding the current location of AFV 12, and include such location information in the emergency message.

Referring back to FIG. 1, output interface 42 of controller 16 communicates emergency messages to transmitter 18. Transmitter 18 may transmit the emergency messages wirelessly, as radio waves configured to be received by a conventional cell phone tower 44. Using conventional cell communication technology, the emergency messages are transmitted to an intended recipient such as an emergency responder communication device 46. In various embodiments, emergency responder communication device 46 may be a 911 system, an emergency responder dispatch system, an emergency responder radio or cell phone, or other device that functions to provide information to one or more first and/or second responders. Emergency responder communication device 46 may communicate the emergency messages to one or more additional emergency responder devices 46. In this manner, emergency responders at, for example, a fire station, may be immediately alerted of an emergency situation involving AFV 12, and provided location and identification information regarding the AFV 12.

The emergency responders may use this information to locate the emergency response manual corresponding to the AFV 12 involved in the emergency, such as by accessing the emergency response manual on line. The emergency responders may use the information from the emergency response manual to suit up with PPE appropriate for the situation and/or bring other equipment that may be useful in addressing the emergency situation (e.g., fans, SCBA equipment, etc.). The emergency responders may obtain the necessary equipment before departing for the location of AFV 12, and review the emergency response guide en route to AFV 12. For example, many AFVs 12 include "no-cut zones" (e.g., areas occupied by high voltage system 20) which present serious risk of injury or death if pierced or otherwise damaged by victim extraction equipment. Emergency responders can identify these "no-cut zones" before arriving at the scene and be prepared to perform any extraction procedures in a manner that avoids these areas of AFV 12. In this manner, the delay associated with locating vehicle identification information, obtaining the appropriate emergency response guide and reviewing the emergency information at the scene of the emergency is eliminated.

Controller 16 of system 10 may also, under appropriate circumstances, respond to receipt of an activation signal by activating discharge device 30, thereby causing discharge device 30 to discharge the stored energy in battery 22 as described herein.

Figure 3:
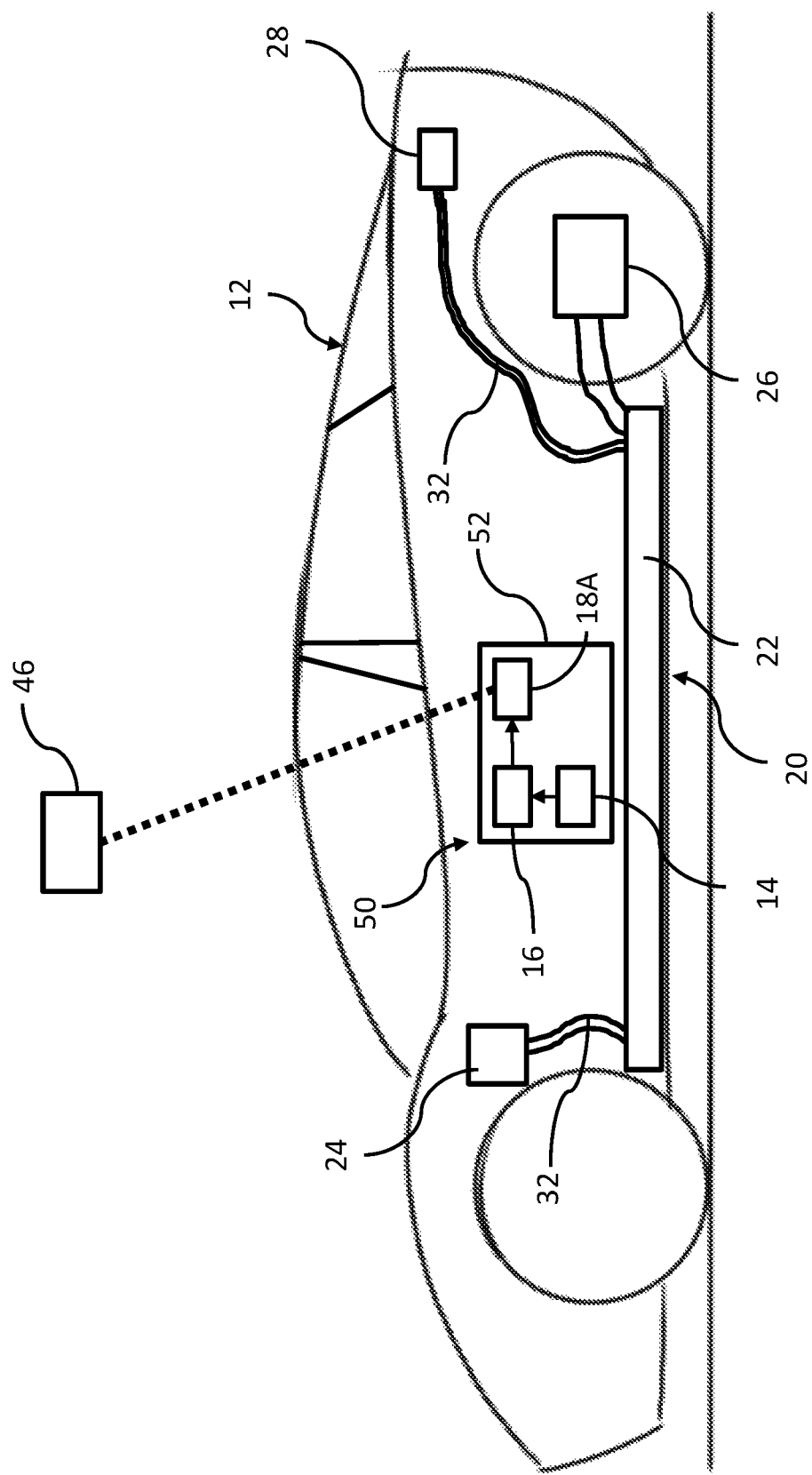
FIG. 3 is a schematic diagram of a vehicle hazard management system according to another embodiment of the present disclosure.

Referring now to FIG. 3, another embodiment of a vehicle hazard management system 50 is shown. In this embodiment, system 50 is configured as a "black box" type device mounted to AFV 12 and configured to withstand significant mechanical force (e.g., from a collision) and heat (e.g., from a fire resulting from a collision, malfunction of high voltage system 20, or otherwise). Sensor 14 and controller 16 may be substantially the same as those described above with reference to vehicle hazard management system 10. Transmitter 18A, on the other hand, unlike transmitter 18, is configured as a local transmitter that communicates with emergency responder communication device 46 on the scene. As such, transmitter 18A may be configured to operate according to Bluetooth wireless protocols or other personal area network technologies. In this manner, when emergency responder communication device 46 comes within range of transmitter 18A, controller 16 provides emergency messages including the information described above directly to emergency responder communication device 46.

It should be understood that while system 50 eliminates the need for emergency responders to identify AFV 12 on site by locating badges and other physical identifiers, system 50 does not provide some of the benefits of system 10 in that preparations cannot be made based on emergency messages prior to dispatch of the emergency responders or while en route to the scene. However, in locations where cellular communications are unavailable, system 10 may be unable to transmit emergency messages. System 50 at least provides the emergency messages to responders arriving at the scene. In other embodiments, AFV 12 is provided with both system 10 and system 50. Of course, such a combined system may combine redundant components and/or otherwise consolidate features and functionality.

Figure 4:
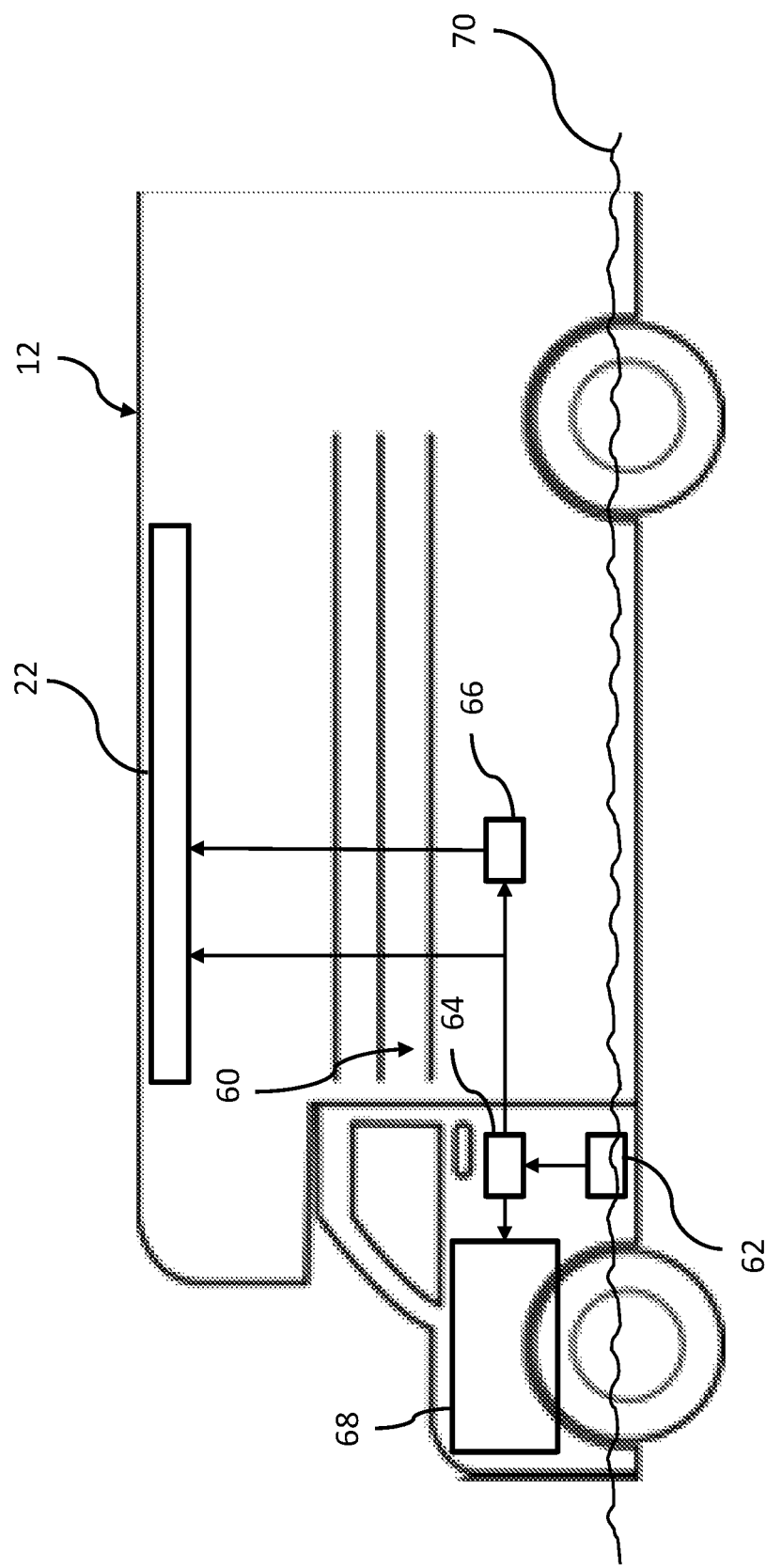
FIG. 4 is a schematic diagram of a vehicle hazard management system according to yet another embodiment of the present disclosure.

Referring now to FIG. 4, another embodiment of a vehicle hazard management system 60 is shown. System 60 generally includes a water sensor 62, a controller 64 and a discharge device 66. In the depicted embodiment, AFV 12 is a hybrid vehicle including an internal combustion engine 68 and a battery 22 (other components of high voltage system 20 are not shown). AFV 12 is shown partially submerged in water 70. On such vehicles, for example certain commercial AFVs, water sensor 62 is positioned to detect water 70 when the level of the water approaches engine 68, and before water 70 reaches battery 22. This may occur when AFV 12 drives through deep water or is parked in an area that becomes flooded. When water sensor 62 detects the presence of water, it sends an activation signal to controller 64 in the manner described above. Controller 64 may respond to the activation signal by automatically deactivating battery 22 or automatically activating discharge device 66 which discharges battery 22, and thereby causes AFV 12 to operate only on mechanical power provided by engine 68.

Figure 5:
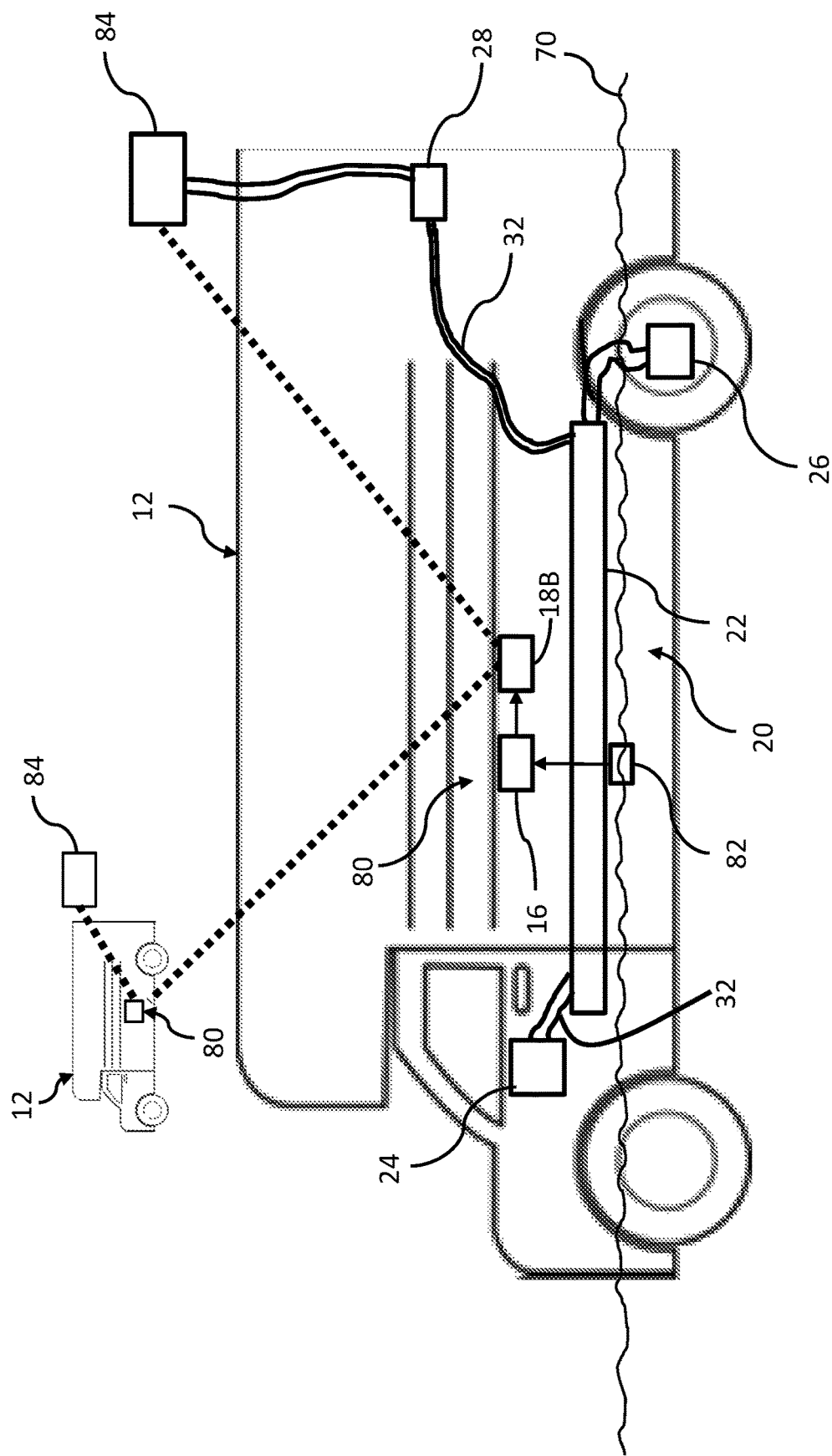
FIG. 5 is a schematic diagram of a vehicle hazard management system according to still another embodiment of the present disclosure.

FIG. 5 depicts yet another embodiment of a vehicle hazard management system 80 according to the principles of the present disclosure. System 80 includes a water sensor 82, a controller 16 and a transmitter 18B and is designed to deactivate a charging station 84 coupled to charge port 28 of high voltage system 20. Water sensor 82 is positioned to detect the presence of water 70 as the level of water approaches battery 22. When water sensor 82 detects water, it provides an activation signal to controller 16 in the manner described above. Sensor 16 responds to the activation signal by causing transmitter 18B, which may be a local transmitter similar to transmitter 18A of system 50 described above, to send a deactivation signal to charging station 84. Charging station 84 responds to receipt of such a deactivation signal by discontinuing charging of AFV 12. In certain embodiments, transmitter 18B is configured to transmit deactivation signals to other adjacent systems 80 mounted to nearby AFVs 12, such as in a situation where a fleet of vehicles are being charged in an area that is flooding. The adjacent systems 80 also transmit deactivation signals to their charging stations 84, causing those charging stations 84 to discontinue charging. In this manner, the first AFV 12 that experiences water submersion can cause all AFVs 12 in this fleet to discontinue charging, even before those AFVs 12 experience flooding.

It should be understood that two or more of the various vehicle hazard management systems described herein may be combined into a single system that provides the functions of the combined individual systems.

As used herein, the modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements. The scope is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B or C may be present in a single embodiment; for example, A and B, A and C, B and C, or A and B and C.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art with the benefit of the present disclosure to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus While the embodiments have been described as having exemplary designs, the present disclosure may be further modified within the spirit and scope of this disclosure. This application is therefore intended to cover any variations, uses, or adaptations of the disclosure using its general principles. Further, this application is intended to cover such departures from the present disclosure as come within known or customary practice in the art to which this invention pertains.

I claim:

1. A vehicle hazard management system mounted to a vehicle having a high voltage system including at least one battery connected to a drive unit and a DC-DC converter, comprising:
 a sensor configured to provide an activation signal in response to at least one of a collision involving the vehicle, a fault of the high voltage system, and at least partial submersion of the vehicle;
 a controller in communication with the sensor, the controller being configured to receive the activation signal and respond by generating an emergency message including information describing at least one of the make, model and year of the vehicle;
 a discharge device coupled to the controller and the at least one battery;
 a transmitter coupled to the controller and configured to transmit the emergency message to a communication device;
 wherein the emergency message includes one of an emergency response guide corresponding to the vehicle or a link to an emergency response guide corresponding to the vehicle; and
 wherein the controller is further configured to respond to receipt of the activation signal from the sensor by causing the discharge device to discharge energy stored in the at least one battery without disconnecting the at least one battery from the drive unit and the DC-DC converter.

2. The vehicle hazard management system of claim 1, wherein the emergency message includes information identifying the vehicle as a hybrid vehicle or an electric vehicle.

3. The vehicle hazard management system of claim 1, wherein the emergency message further includes information identifying the location of the vehicle.

4. The vehicle hazard management system of claim 1, wherein the transmitter transmits the emergency message to a cell tower, which relays the emergency message to the communication device.

5. The vehicle hazard management system of claim 1, wherein the transmitter is a Bluetooth transmitter.

6. The vehicle hazard management system of claim 1, wherein the controller further includes a GPS unit configured to determine a current location of the vehicle.

7. The vehicle hazard management system of claim 1, wherein the controller is further configured to respond to the activation signal by deactivating the high voltage system and enabling an engine to power the vehicle.

8. The vehicle hazard management system of claim 1, wherein the controller is further configured to respond to the activation signal by causing the transmitter to transmit a deactivation signal to deactivate a charging station coupled to the high voltage system.

9. The vehicle hazard management system of claim 8, wherein the controller is further configured to respond to the activation signal by causing the transmitter to transmit the deactivation signal to another vehicle hazard management system.

10. A vehicle hazard management system mounted to a vehicle having a high voltage system including at least one battery connected to a drive unit and a DC-DC converter, comprising:
 a water sensor configured to provide an activation signal in response detection of at least partial submersion of the vehicle;
 a controller in communication with the water sensor; and
 a high voltage system discharge device in communication with the controller and connected to the at least one battery;
 wherein the controller is configured to respond to receipt of an activation signal from the water sensor by causing the high voltage system discharge device to discharge energy stored in the at least one battery without disconnecting the at least one battery from the drive unit and the DC-DC converter and
 wherein the controller is further configured to respond to the activation signal by causing a transmitter to transmit a deactivation signal to deactivate a charging station coupled to the high voltage system.

11. The vehicle hazard management system of claim 10, wherein the controller is further configured to response to the activation signal by causing the transmitter to transmit the deactivation signal to another vehicle hazard management system.

12. A method of managing hazards associated with a vehicle having a high voltage system including at least one battery connected to a drive unit and a DC-DC converter, comprising:
 sensing an activation event including at least one of a collision involving the vehicle, a fault of the high voltage system, and at least partial submersion of the vehicle;
 generating an activation signal in response to the sensed activation event;
 responding to the activation signal by generating an emergency message including information describing at least one of the make, model and year of the vehicle;
 transmitting the emergency message to a communication device;
 responding to the activation signal by causing a discharge device to discharge energy stored in the at least one battery without disconnecting the at least one battery from the drive unit and the DC-DC converter; and
 wherein the emergency message includes one of an emergency response guide corresponding to the vehicle or a link to an emergency response guide corresponding to the vehicle.

13. The method of claim 12, wherein the emergency message further includes information identifying the location of the vehicle.

14. The method of claim 12, wherein transmitting the emergency message to a communication device further comprises transmitting the emergency message to a cell tower, which relays the emergency message to the communication device.

15. The method of claim 12, wherein responding to the activation signal further comprises deactivating a charging station coupled to the high voltage system.

* * * * *